(12) United States Patent
Gilmore

(10) Patent No.: US 8,362,644 B2
(45) Date of Patent: Jan. 29, 2013

(54) DEVICE, SYSTEM, AND METHOD FOR MANAGING AN APPLICATION OF POWER FROM PHOTOVOLTAIC ARRAYS

(75) Inventor: Jack Arthur Gilmore, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 911 days.

(21) Appl. No.: 12/326,209

(22) Filed: Dec. 2, 2008

(65) Prior Publication Data

US 2010/0132758 A1    Jun. 3, 2010

(51) Int. Cl.
*H02J 1/10* (2006.01)
(52) U.S. Cl. .......................................................... 307/51
(58) Field of Classification Search .................... 307/51; 136/244
See application file for complete search history.

(56) References Cited

U.S. PATENT DOCUMENTS

| | | |
|---|---|---|
| 3,986,097 A | 10/1976 | Woods |
| 4,025,862 A | 5/1977 | Gautheron |
| 4,054,827 A | 10/1977 | Reimers |
| 4,080,646 A | 3/1978 | Dietrich |
| 4,128,793 A | 12/1978 | Stich |
| 4,161,023 A | 7/1979 | Goffeau |
| 4,678,983 A | 7/1987 | Rouzies |
| 4,748,311 A | 5/1988 | Thomas |
| 4,768,096 A | 8/1988 | Cannella et al. |
| 5,270,636 A | 12/1993 | Lafferty |
| 5,451,962 A | 9/1995 | Steigerwald |
| 5,781,419 A | 7/1998 | Kutkut et al. |
| 5,923,100 A | 7/1999 | Lukens et al. |
| 5,932,994 A | 8/1999 | Jo et al. |
| 6,093,885 A | 7/2000 | Takehara et al. |
| 6,115,273 A | 9/2000 | Geissler |
| 6,266,260 B1 | 7/2001 | Zahrte, Sr. et al. |
| 6,404,655 B1 | 6/2002 | Welches |
| 6,414,866 B2 | 7/2002 | Huggett et al. |

(Continued)

FOREIGN PATENT DOCUMENTS

| | | |
|---|---|---|
| JP | 05-025890 A | 2/1993 |
| JP | 06-252434 A | 9/1994 |

(Continued)

OTHER PUBLICATIONS

Sohn, Seung C., "Notice of Non-Compliant Amendment Office Action re U.S. Appl. No. 12/189,187", Aug. 12, 2009, p. 2 Published in: US.

(Continued)

*Primary Examiner* — Michael Rutland Wallis
(74) *Attorney, Agent, or Firm* — Neugeboren O'Dowd PC

(57) ABSTRACT

A system, method, and apparatus for managing an application of power from photovoltaic arrays to power conversion components. The method may include arranging a first array and a second array in series, coupling a positive terminal of a first array to the power conversion component, coupling a negative terminal of a second array to the power conversion component, and modulating an amount of current flowing between a negative terminal of the first array and a positive terminal of the second array so as to ramp up a level of current flowing through the arrays as the arrays are brought online with the power conversion component. A voltage of any terminal on either of the arrays may be limited so that the voltage on any of the terminals does not reach a restricted level.

6 Claims, 10 Drawing Sheets

U.S. PATENT DOCUMENTS

| | | | |
|---|---|---|---|
| 6,625,046 B2 | 9/2003 | Geissler | |
| 6,750,391 B2 | 6/2004 | Bower et al. | |
| 6,812,396 B2 | 11/2004 | Makita et al. | |
| 6,844,739 B2 | 1/2005 | Kasai et al. | |
| 6,914,418 B2 | 7/2005 | Sung | |
| 7,053,506 B2 | 5/2006 | Alonso et al. | |
| 7,158,395 B2 | 1/2007 | Deng et al. | |
| 7,193,872 B2 | 3/2007 | Siri et al. | |
| 7,292,419 B1 | 11/2007 | Nemir | |
| 7,371,963 B2 | 5/2008 | Suenaga et al. | |
| 7,456,524 B2 | 11/2008 | Nielsen et al. | |
| 7,619,200 B1* | 11/2009 | Seymour et al. | 250/214 R |
| 7,701,081 B2 | 4/2010 | Seymour | |
| 7,768,751 B2* | 8/2010 | Gilmore et al. | 361/42 |
| 2001/0004322 A1 | 6/2001 | Kurokami et al. | |
| 2001/0023703 A1 | 9/2001 | Kondo et al. | |
| 2001/0048605 A1 | 12/2001 | Kurokami et al. | |
| 2002/0105765 A1 | 8/2002 | Kondo et al. | |
| 2003/0111103 A1 | 6/2003 | Bower et al. | |
| 2003/0155887 A1 | 8/2003 | Bourilkov et al. | |
| 2003/0172968 A1 | 9/2003 | Armer et al. | |
| 2004/0211459 A1 | 10/2004 | Suenaga et al. | |
| 2005/0139259 A1 | 6/2005 | Steigerwald et al. | |
| 2005/0180181 A1 | 8/2005 | Gaudreau et al. | |
| 2005/0279402 A1 | 12/2005 | Ahn et al. | |
| 2006/0162772 A1 | 7/2006 | Presher, Jr. et al. | |
| 2006/0221653 A1 | 10/2006 | Lai et al. | |
| 2006/0227472 A1 | 10/2006 | Taylor et al. | |
| 2008/0291706 A1 | 11/2008 | Seymour et al. | |
| 2009/0032082 A1* | 2/2009 | Gilmore et al. | 136/244 |
| 2009/0078304 A1 | 3/2009 | Gilmore et al. | |
| 2009/0167086 A1 | 7/2009 | Seymour | |
| 2009/0167097 A1 | 7/2009 | Seymour et al. | |
| 2009/0190275 A1 | 7/2009 | Gilmore et al. | |
| 2009/0217964 A1 | 9/2009 | Gilmore et al. | |
| 2009/0283130 A1 | 11/2009 | Gilmore et al. | |
| 2010/0132758 A1 | 6/2010 | Gilmore | |
| 2010/0308662 A1* | 12/2010 | Schatz et al. | 307/80 |
| 2011/0157753 A1 | 6/2011 | Gilmore et al. | |

FOREIGN PATENT DOCUMENTS

| | | |
|---|---|---|
| JP | 07-049721 A | 2/1995 |
| JP | 09-054623 A2 | 2/1997 |
| JP | 10-014111 | 1/1998 |
| JP | 10-229679 | 8/1998 |
| JP | 11-285260 A | 10/1999 |
| JP | 2000-295786 A | 10/2000 |
| JP | 2000-358370 A | 12/2000 |
| JP | 2002-319687 A | 10/2002 |
| JP | 2003-124492 A | 4/2003 |
| JP | 2004-015941 A | 1/2004 |
| JP | 2004-343909 A | 12/2004 |
| JP | 2005-204485 A | 7/2005 |
| JP | 2006-187150 A | 7/2006 |
| JP | 2007-201257 A | 8/2007 |
| KR | 10-2006-0100840 | 9/2006 |
| KR | 20-2006-0021132 | 10/2006 |
| WO | 2007022955 A1 | 8/2006 |

OTHER PUBLICATIONS

Nguyen, Danny, "Office Action re U.S. Appl. No. 12/022,147", Jan. 22, 2010, p. 46 Published in: US.

Sohn, Seung C., "Office Action re U.S. Appl. No. 12/189,187", Apr. 3, 2009, p. 14 Published in: US.

Sohn, Seung C., "Office Action re U.S. Appl. No. 11/967,933", Oct. 4, 2010, p. 29 Published in: US.

Gardner, Shannon M., "Office Action re U.S. Appl. No. 12/184,535", Nov. 10, 2010, p. 7 Published in: US.

Moyse, Ellen, "International Preliminary Report on Patentability and Written Opinion re U.S. Appl. No. PCT/US08/072108", Feb. 18, 2010, Published in: PCT.

Nickitas-Etienne, Athina, "International Preliminary Report on Patentability and Written Opinion re Application No. PCT/US09/031549", Aug. 12, 2010, Published in: PCT.

Honda, Masashi, "International Preliminary Report on Patentability and Written Opinion re Application PCT/US09/051855", Feb. 24, 2011, Published in: PCT.

Ha, Jeong Kyun, "PCT International Search Report re Application No. PCT/US09/054904", Aug. 23, 2010, Published in: PCT.

O'Dowd, Sean R., "Response to Oct. 4, 2010 Office Action re U.S. Appl. No. 11/967,933", Jan. 1, 2011, p. 6 Published in: US.

O'Dowd, Sean R., "Response to Jan. 22, 2010 Office Action re U.S. Appl. No. 12/022,147", Feb. 25, 2010, p. 28 Published in: US.

O'Dowd, Sean R., "Response to Nov. 10, 2011 Office Action re U.S. Appl. No. 12/184,535", Mar. 10, 2011, p. 14 Published in: US.

O'Dowd, Sean R., "Response to Apr. 3, 2009 Office Action re U.S. Appl. No. 12/189,187", Jun. 29, 2009, p. 51 Published in: US.

O'Dowd, Sean R., "Response to Notice of Non-Compliant Amendment re U.S. Appl. No. 12/189,187", Aug. 13, 2009, p. 10 Published in: US.

Gilmore, Jack Arthur, "U.S. Appl. No. 12/830,380 'Energy Conversion System with Fault Detection and Interruption'", Jul. 5, 2010, Published in: US.

Zhang, Michael T., et al., "Single-Phase Three-Level Boost Power Factor Correction Converter", "Applied Power Electronic Conference and Exposition", Mar. 1, 1995, pp. 434-439, vol. 1, Publisher: IEEE, Published in: US.

Pinheiro, J.R., et al., "Dual Output Three-Level Boost Power Factor Correction Converter with Unbalanced Loads", "Power Electronics Specialists Conference", Jun. 1, 1996, pp. 733-739, vol. 1, Publisher: IEEE, Published in: US.

Sun Power, "Sun Power Discovers the Surface Polarization Effect in High Efficiency Solar Cells", Aug. 1, 2005, Published in: US.

Nguyen, Danny, "Office Action re U.S. Appl. No. 12/830,380", Jun. 3, 2011, p. 28 Published in: US.

Gardner, Shannon M., "Office Action re U.S. Appl. No. 12/184,535", Jun. 17, 2011, p. 9 Published in: US.

Athina Nickitas-Etienne, "International Preliminary Report on Patentability re Application No. PCT/US09/65629", Jun. 16, 2011, Published in: CH.

IEEE, "Std. 519-1992", "IEEE Recommended Practices", Apr. 12, 1993, pp. 1-100, Publisher: IEEE.

Yao, Gang, et al., "Interleaved Three-Level Boost Converter with Zero Diode Reverse-Recovery Loss", "Applied Power Electronics Conference and Exposition", Sep. 1, 2004, pp. 1090-1095, vol. 2, Publisher: IEEE, Published in: US.

Gow, J.A., et al., "Photovoltaic Converter System Suitable for Use in Small Scale Stand-Alone or Grid Connected Applications", "Proceedings Electric Power Applications", Nov. 1, 2000, pp. 535-543, vol. 147, No. 6, Publisher: IEEE, Published in: US.

Kwon, Jung-Min, et al., "Photovoltaic Power Conditioning System with Line Connection", "Transaction on Industrial Electronics", Aug. 1, 2006, pp. 1048-1054, vol. 53, No. 4, Publisher: IEEE, Published in: US.

Enslin, Johan, et al., "Integrated Photovoltaic Maximum Power Point Tracking Converter", "Transactions on Industrial Electronics", Dec. 1, 1997, pp. 769-773, vol. 44, No. 6, Publisher: IEEE, Published in: US.

Walker, Geoffrey R., et al., "Cascaded DC-DC Converter Connection of Photovoltaic Modules", "Transactions on Power Electronics", Jul. 1, 2004, pp. 1130-1139, vol. 19, No. 4, Publisher: IEEE, Published in: US.

Kim, Jung-Han, et al., "A Study on the Harmonic Elimination used Passive Filter and Active Filter", "KIIEE", 2001, pp. 77-83, Publisher: KIIEE, Published in: KR.

Ahmed, K.H., et al., "Passive Filter Design for Three-Phase Inverter Interfacing in Distributed Generation", "Electrical Power Quality and Utilization Journal", 2007, Page(s) abstract, Fig. 1 19, vol. 13, No. 2, Published in: US.

Choi, Nam Ho, "PCT International Search Report re Application No. PCT/US08/064263", Oct. 31, 2008, Published in: PCT.

Park, Jae Hun, "PCT International Search Report re Application No. PCT/US08/072108", Feb. 24, 2009, Published in: PCT.

Giffo-Schmitt, Beate, "PCT International Preliminary Report on Patentability re PCT/US08/077724", May 27, 2010, Published in: PCT.

Koh, Jae Hyun, "PCT International Search Report re Application No. PCT/US08/077734", Apr. 29, 2009, Published in: PCT.

Bae, Jin Yong, "PCT International Search Report re Application No. PCT/US08/086931", Jun. 25, 2009, Published in: PCT.

Bae, Jin Yong, "PCT International Search Report re Application No. PCT/US08/087078", Jul. 9, 2009, Published in: PCT.

Han, Sang Il, "PCT International Search Report re Application No. PCT/US09/031549", Aug. 17, 2009, Published in: PCT.

Ha, Jeong Kyun, "PCT International Search Report re Application No. PCT/US09/051855", Mar. 22, 2010, Published in: PCT.

Guinea, William, "PCT International Search Report re Application No. PCT/US09/065629", Feb. 12, 2010, Published in: PCT.

Wang, T.C., et al., "Output Filter Design for a Grid-Interconnected Three-Phase Inverter", "IEEE", 2003, pp. 779-784, Publisher: IEEE, Published in: US.

Woo Hyuk Lee, "A Study on the Optimaztion of Input Filter for Switching Inverter", "Master Thesis", 1989, Publisher: Hanyang University.

Henry E. Lee, III, "Office Action re Patent Application 13/122,950", Jul. 14, 2011, p. 43 Published in: US.

Borroto, Alfonso Perez, "Office Action re U.S. Appl. No. 12/507,019", Nov. 14, 2011, p. 51 Published in: US.

Korean Intellectual Property Office, "Office Action re Korean Application No. 10-2009-7025699", Jun. 1, 2011, p. 12 Published in: KR.

Sean R. O'Dowd, "Response to Jun. 3, 2011 Office Action re U.S. Appl. No. 12/830,380", Sep. 16, 2011, Published in: US.

Kolev, Vesselin, "International Search Report and Written Opinion re Application PCT/US11/023081", Apr. 27, 2011, p. 12 Published in: AU.

* cited by examiner

DEVICE, SYSTEM, AND METHOD FOR MANAGING AN APPLICATION OF POWER FROM PHOTOVOLTAIC ARRAYS

FIELD OF THE INVENTION

This invention relates generally to apparatus and methods for converting solar energy to electrical energy, and more specifically to apparatus and methods for controlling an application of power from photovoltaic arrays to power conversion components.

BACKGROUND OF THE INVENTION

The transformation of light energy into electrical energy using photovoltaic (PV) systems has been known for a long time and these photovoltaic systems are increasingly being implemented in residential, commercial, and industrial applications. Although developments and improvements have been made to these photovoltaic systems over the last few years to improve their efficiency, the efficiency of the photovoltaic systems is still a focal point for continuing to improve the economic viability of photovoltaic systems.

Photovoltaic systems typically include, among other components, a photovoltaic array that generates DC power and an inverter that converts the DC power to AC power (e.g., single or three phase power). It is often desirable to design and operate photovoltaic arrays so that the voltage that is output is relatively high, and hence current is low, in order to reduce costs associated with high-current elements and to reduce energy losses.

Photovoltaic arrays that include crystalline (e.g., monocrystalline or polycrystalline) silicon, for example, may operate in an open load state at 1200 Volts and amorphous silicon may operate in an open load state at 1400 Volts. Although arrays are capable of applying high open loaded voltages, arrays rarely do so because once power is drawn from the arrays, the loaded voltage of the array drops substantially. For example, under loaded conditions, crystalline silicon arrays may operate at between 780 to 960 volts and amorphous silicon may operate around 680 Volts.

Inverters are available in a variety of voltage ratings to accommodate the infrequently encountered unloaded voltage conditions of the array. But inverters that are rated for higher voltages typically cost more and operate less efficiently than inverters that are designed to operate at lower voltages. And as a consequence, inverters are often designed with silicon that is less efficient and costlier than silicon that could be used if the inverter did not have to be designed to handle high, open load voltages. For example, inverters incorporating silicon rated for voltages around 1400 Volts incur substantially more losses, and cost substantially more than inverters that utilize silicon that is rated for 1200 Volt applications.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

In one embodiment, the invention may be characterized as a photovoltaic system that includes a first photovoltaic array that includes a portion that is disposed above ground potential and includes a positive terminal and a negative terminal; a second photovoltaic array that includes a portion that is disposed below ground potential and includes a negative terminal and a positive terminal; a power conversion component coupled to both, the positive terminal of the first photovoltaic array and the negative terminal of the second photovoltaic array, the power conversion component adapted to convert a voltage between the positive terminal of the first photovoltaic array and the negative terminal of the second photovoltaic array from one form to another form; and an array coupler configured to electrically couple the negative terminal of the first array and the positive terminal of second array and to modulate an amount of current flowing through the first and second photovoltaic arrays.

In another embodiment the invention may be characterized as a method for coupling photovoltaic arrays with a power conversion component. The method including arranging a first array and a second array in series; coupling a positive terminal of the first array to the power conversion component; coupling a negative terminal of the second array to the power conversion component; modulating an amount of current flowing between a negative terminal of the first array and a positive terminal of the second array so as to ramp up a level of current flowing through the arrays as the arrays are brought online with the power conversion component; and limiting a voltage of any terminal on either of the arrays so that the voltage on any of the terminals does not reach a restricted level.

In yet another embodiment, the invention may be characterized as an apparatus for coupling photovoltaic arrays. The apparatus including: a first input adapted to couple to a negative terminal of a first photovoltaic array; a second input adapted to couple to a positive terminal of a second photovoltaic array; a contactor configured to switchably couple the negative line of the first photovoltaic array to the a positive line of a second photovoltaic array so as to place the first and second photovoltaic arrays in series, the contactor being controllable by an electric control signal; and a current modulator configured to modulate an amount of current flowing through the first and second photovoltaic arrays.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Figure 1:
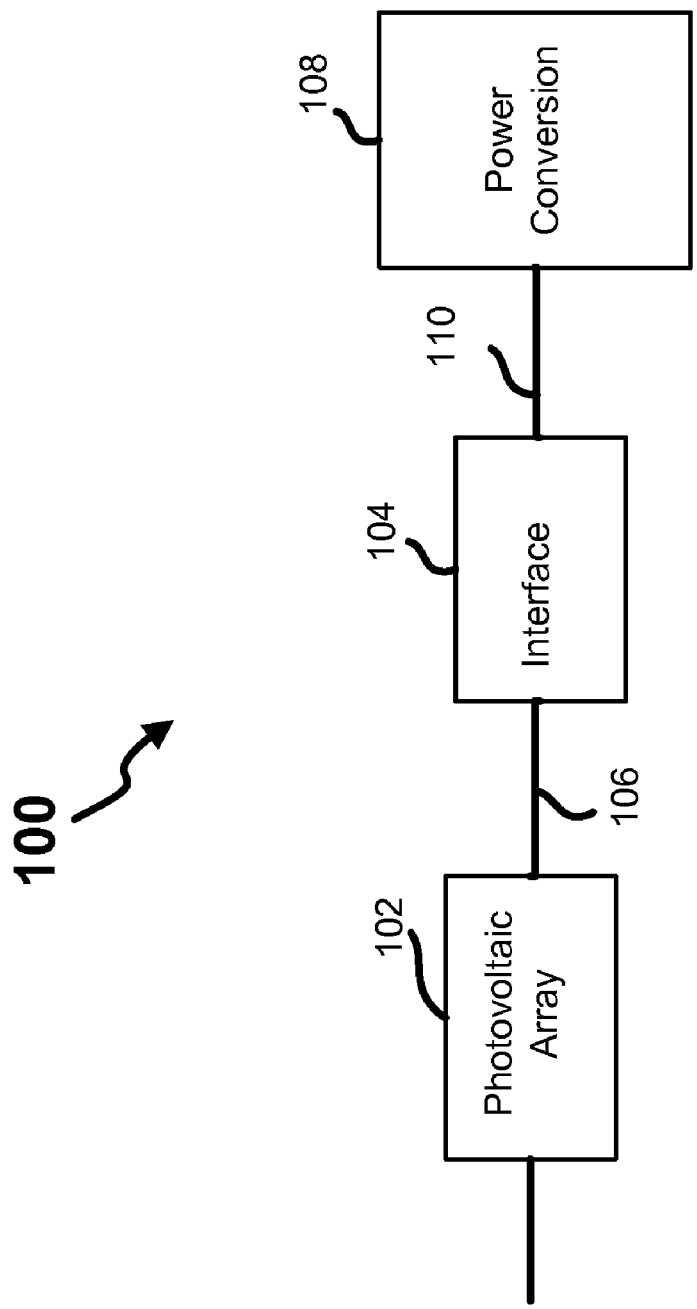
FIG. 1 is a block diagram depicting an exemplary embodiment of a photovoltaic system.

Referring now to the drawings, where like or similar elements are designated with identical reference numerals throughout the several views, and referring in particular to FIG. 1, it is a block diagram depicting a photovoltaic system 100, that includes a photovoltaic array 102 coupled to a power converter 108 via a photovoltaic (PV) interface 104.

In general, the photovoltaic array 102 converts solar energy to DC electrical power, which is converted to AC power (e.g., three-phase power) by the inverter 108. And the PV interface 104 generally operates to enable the power conversion component 108, which is designed to operate at lower voltages, to be utilized in connection with the PV array 102 that operates at least a portion of the time (e.g., while unloaded) at a voltage that exceeds the designed operating voltage of the power converter 108.

In general, the power converter 108 converts power that is applied by the array 102 from one form to another form. In some embodiments, the power converter 108 includes an inverter to convert DC power provided by the array to AC power. In other embodiments, the power conversion component 108 includes DC to DC power conversion components, which may be used to convert the power from the array 102 to a higher or lower voltage.

In many embodiments, the PV interface 104 is a low duty factor device, which operates only briefly during startup and/or shut down, to gradually connect or disconnect the PV array 102 to the power converter 108. In some embodiments for example, the PV interface 104 operates for one, or just a few, second(s) during startup and/or shut down. In some implementations for example, the duty cycle of a switching segment in the interface is pulse width modulated from a low to a high duty cycle (e.g., from 10% to 100%) to gradually load the PV array 102, and as a consequence, reduce a voltage of the array 102 from an initial voltage (e.g., unloaded voltage) to a lower voltage (e.g., approximately an optimal voltage of the power converter 108).

Once the PV array 102 is loaded, and the voltage of the PV array is reduced from its initial voltage, the interface 104 couples the PV array 102 to the power converter 108 and the switching segment of the interface 104 is removed from operation. As a consequence, in many embodiments, the power converter 108 is not exposed to the potentially damaging open load voltages of the PV array 102, and during steady state operation (e.g., after the voltage of the PV array 102 is reduced), the effect of the switching segment of the interface 104 upon the efficiency of the system 100 is insubstantial. In several embodiments, however, the efficiency of the system 100 is substantially improved relative to the prior art because the power converter 108 is realized by silicon that is designed to operate at voltages that are lower than the initial (e.g., unloaded voltage) of the PV array 102.

As discussed further herein, in some embodiments the photovoltaic array 102 is a bipolar array, and in many of these embodiments, at least a portion of the array 102 is disposed so as to operate at a positive voltage with respect to ground while another portion of the array 102 operates below ground. But this is certainly not required, and in other embodiments the photovoltaic array 102 is a monopolar array, which in some variations operates at voltages substantially higher than ground or lower than ground.

In some embodiments, the cells in the array 102 include crystalline (e.g., monocrystalline or polycrystalline) silicon that operates in an open load state at 1200 Volts and operates in a loaded state between 780 and 960 Volts. And in other embodiments the array includes cells comprising amorphous silicon that operates in an open load state at 1400 Volts and a loaded state around 900 Volts. One of ordinary skill in the art will appreciate, however, that the photovoltaic array 102 may include a variety of different type photovoltaic cells that are disposed in a variety of different configurations. For example, the photovoltaic cells may be arranged in parallel, in series or a combination thereof.

As discussed further herein, several embodiments of the interface 104 beneficially enable low cost and efficient inverters to be utilized in connection with efficient, high voltage PV arrays. For example, instead of utilizing 1400 Volt silicon (e.g., in IGBTs of the power converter 108) to accommodate 1400 Volt open-load PV voltages, in some embodiments 1200 Volt silicon is implemented in the power converter 108, which is roughly half the cost of 1400V silicon and is much more efficient.

Figure 2:
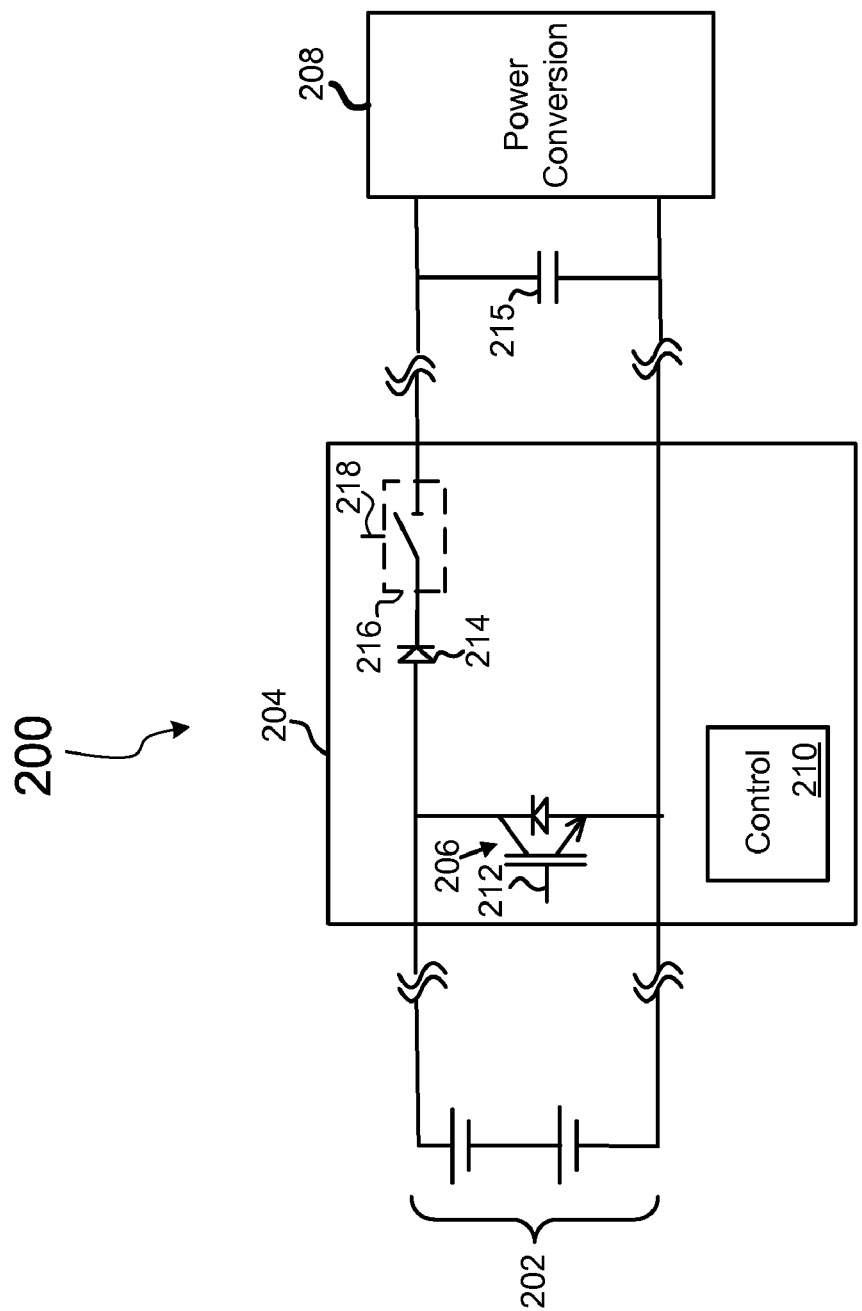
FIG. 2 is a schematic representation of an exemplary embodiment of the system described with reference to FIG. 1.

Referring next to FIG. 2, shown is a schematic representation of an exemplary embodiment of the system 100 described with reference to FIG. 1. As shown in the system 200 depicted in FIG. 2, a bipolar photovoltaic array 202 is coupled to an power converter 208 via an exemplary interface 204 that includes a switching segment comprising a shunt switch 206 arranged and configured to couple the power converter 208 to the array 202 without the power converter 208 being exposed to the potentially damaging open-load voltages of the array 202.

As shown, the shunt switch 206 is disposed across the positive and negative rails of the array 202 and is coupled to a control segment 210 of the interface 204 by an input lead 212. In addition, a diode 214 is arranged in series, along a positive rail of the system 200, with a contactor 216, which is coupled to the control segment 210 by a control lead 218. Although not depicted, the negative rail of the interface in many implementations also includes a DC contactor to disconnect and connect the negative output of the array 202 to the power converter 208.

In many embodiments, the switch 206 is an insulated-gate bipolar transistor (IGBT) disposed so that a collector-emitter current path of the IGBT is coupled between the positive and negative rails of the interface 204, and the gate of the switch 206 is coupled to the control lead 212. In other embodiments, however, the switch 206 is implemented by other switching technologies without departing from the scope of the claimed invention.

In some embodiments, the control segment 210 is realized by a processor that is configured to execute instructions stored in a memory, but this is not required, and in other embodiments the control segment 210 is realized by hardware. It is also contemplated that the control segment 210 in yet other embodiments is implemented by a combination of hardware and software. It should also be recognized that the depiction of the control segment 210 is merely logical and that the interface 204 may be controlled by control components that are distributed within and/or outside of the interface 204.

In some embodiments the interface 204 is utilized during start-up to bring the power converter 208 online with the array 202 while the array 202 is generating an initial voltage that is potentially damaging to the power converter 208. And in other embodiments, the interface 204 is employed during shut down to remove the power converter 208 from the array while the array 202 is still applying a substantial voltage across the rails of the system 200. And in yet other embodiments, the interface 204 is used both during start-up and shut down.

During an exemplary start-up process, the capacitor 215 is charged to approximately an operating voltage (e.g., approximately 900 Volts) of the power converter 208 (e.g., using soft start switch gear not shown or the PV array 202), and the power converter 208 is turned on with the contactor 216 open. The shunt switch 206 is then closed so that the array 202 is shorted out, and then the contactor 216 is closed before current is forced into the power converter 208 by opening the shunt switch 206. The diode 214 in this embodiment prevents damage to the bus capacitor 215 while the shunt switch 206 is closed.

During shut down, in one embodiment, the shunt switch 206 is closed so as to prevent a substantial amount of current from flowing through the contactor 216 to the power converter 208. The contactor 216 is then opened 216 to isolate the power converter 208 from the array 202, and then the shunt switch 206 is opened.

Figure 3:
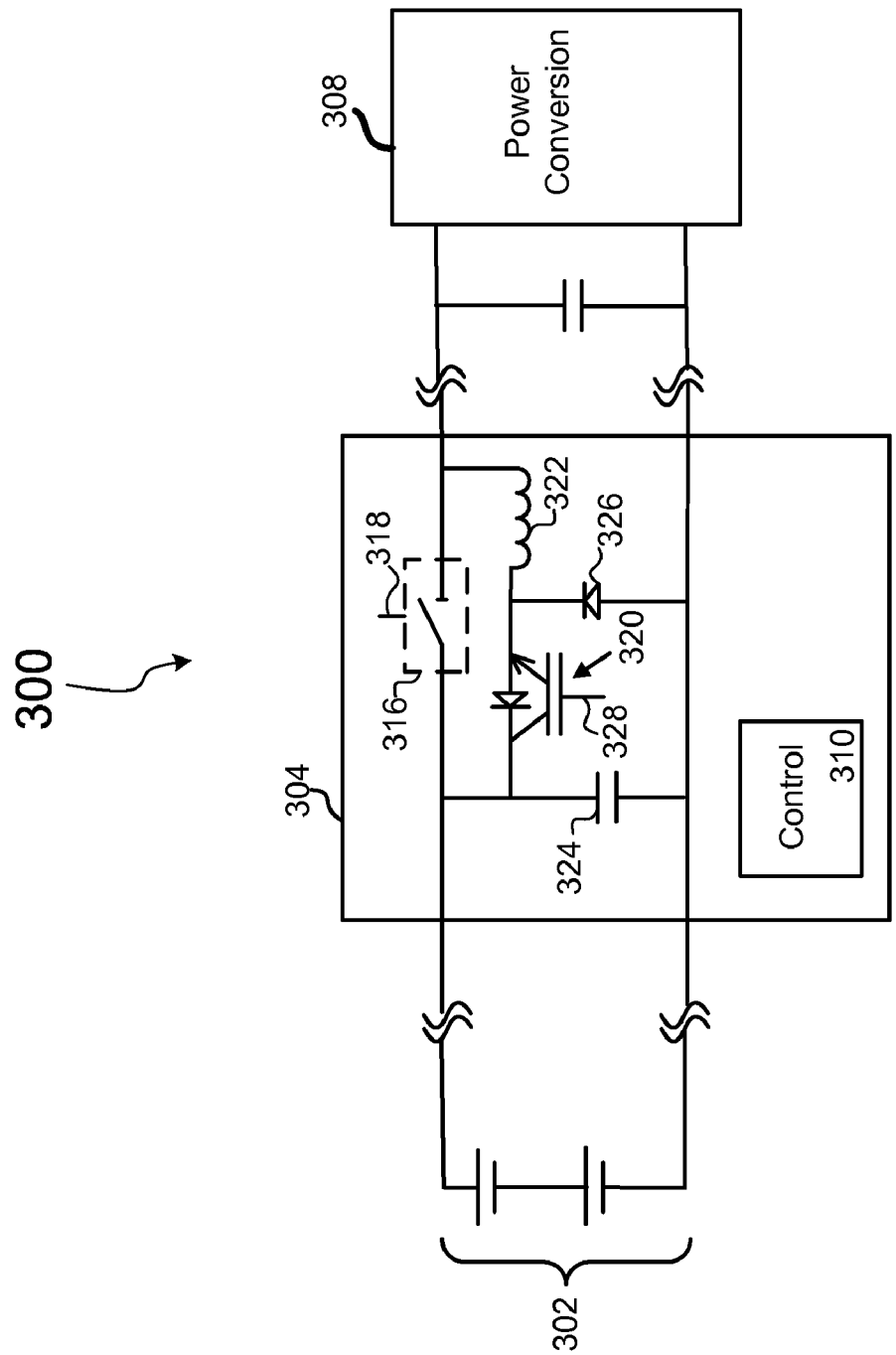
FIG. 3 is a schematic representation of another embodiment of the system described with reference to FIG. 1.

Referring next to FIG. 3, shown is a schematic representation of another embodiment of the system described with reference to FIG. 1. As shown, the system 300 in this embodiment includes an array 302, which is coupled to a power converter 308 via an interface 304 that is realized in part by a switching segment, which includes a switch 320 that is arranged in series along a positive rail of the system 300. As depicted, the switch 320 is arranged, along with an inductor 322, in a path that is parallel to a DC contactor 316, which is disposed along the positive rail of the interface 304. Also shown are a capacitor 324 that is coupled between the positive and negative rails of the interface 302 and a circulating diode 326 that is coupled between a junction of the switch 320 and the inductor 322. In this embodiment, a control segment 310 is coupled to both an input lead 328 of the switch 320 and a control lead 318 of the contactor 316.

Figure 4A:
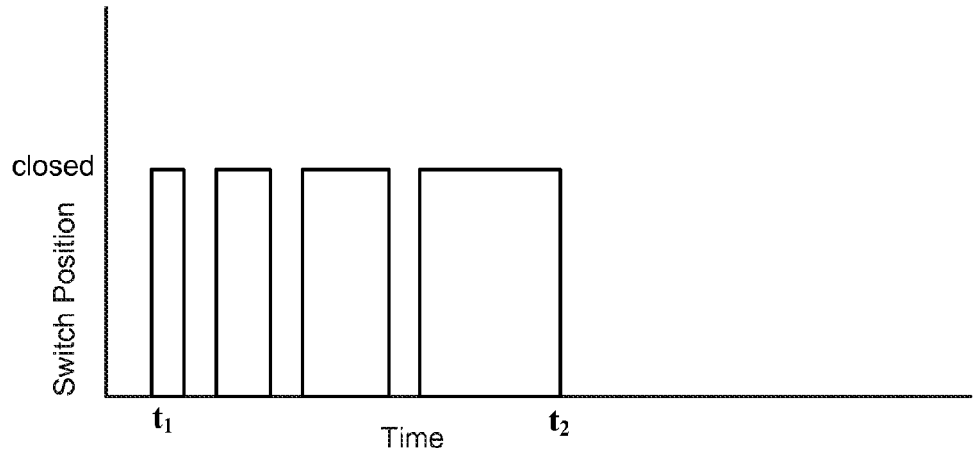
FIG. 4A is a graph depicting, as a function of time, a position of the switch depicted in FIG. 3.
Figure 4B:
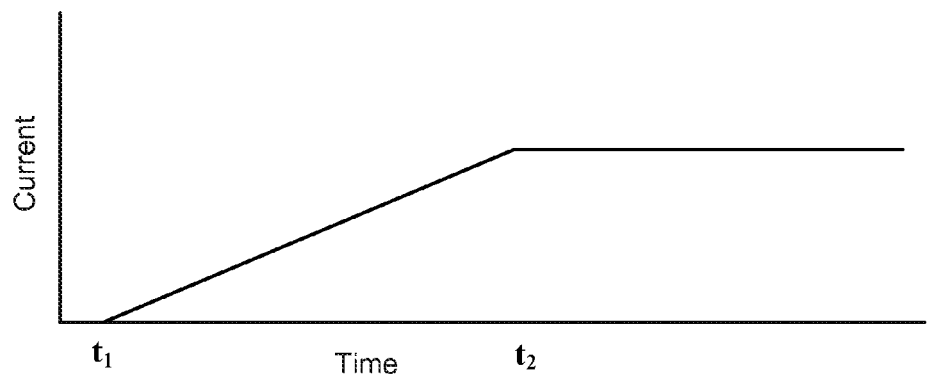
FIG. 4B is a graph depicting, as a function of time, current flowing from the array to the inverter depicted in FIG. 3.
Figure 4C:
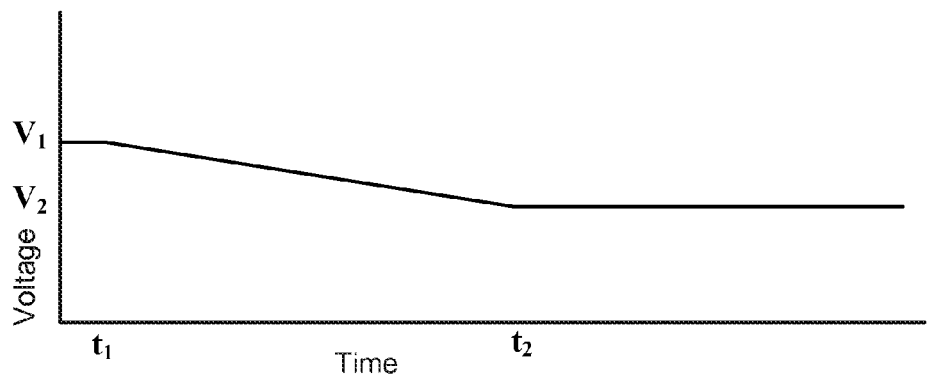
FIG. 4C is a graph depicting, as a function of time, a voltage of the photovoltaic array depicted in FIG. 3.

In many modes of operation, the interface 304 depicted in FIG. 3 operates to gradually couple the array 302 to the power converter 308 so that the power converter 308 is not exposed to potentially damaging voltages (e.g., open load voltages) of the array 302. Referring to FIGS. 4A, 4B and 4C, for example, shown are graphs depicting, as a function of time, a position of switch 320, current flowing from the array 302 to the power converter 308, and the voltage of the array 302, respectively.

As shown, initially when the array 302 is exposed to sunlight, but is not yet coupled to the power converter 308, the contactor 316 is open and the array 302 applies an open load voltage $V_1$ to the interface 304, but no current flows from the array 302, through the interface 304, to the power converter 308. At a time $t_1$ the switch 320 is closed briefly, as shown in FIG. 4A; current begins to flow through the interface 304 as depicted in FIG. 4B; and as shown in FIG. 4C, the voltage output by the array 302 begins to drop below $V_1$.

As shown in FIG. 4A, in this exemplary mode of operation, the signal 328 to the switch 320, and hence the closure of the switch 320, is pulse-width modulated so that the switch 320 is closed for successively longer amounts of time between times $t_1$ and $t_2$. As depicted in FIGS. 4A, 4B, and 4C, while the duty cycle of the switch 320 is increased between times $t_1$ and $t_2$, the current through the interface 304, from the array 302 to the power converter 308, continues to increase, and the voltage at an output of the array 302 continues to drop from $V_1$ to $V_2$. In one embodiment, the switch 320 is pulse-width modulated so that the duty cycle of the switch 320 varies from approximately 10% to 100% from time $t_1$ and $t_2$, and the switch 320 is pulsed (and closed) approximately 100 times over approximately a one second time period between $t_1$ and $t_2$, but this is certainly not required, and in other embodiments, other modulation schemes are utilized.

In many embodiments, once the voltage output by the array 302 is reduced to a desirable level (e.g., a level that is tolerable to the power converter 308 and/or an optimal level for power transfer), the contactor 316 is closed and the switch 320 is opened so that the voltage $V_2$ output from array 302 is applied to the power converter 308. In some embodiments for example, the voltage $V_1$ is approximately 1200 VDC and $V_2$ is approximately 900 VDC.

In some embodiments, the interface 304 is also configured to decouple the power converter 308 from the array 302 while the array 302 is applying a substantial voltage (e.g., full-load voltage) to the power converter 308. In these embodiments, the switch 320 is closed, and then the contactor 316 is opened so as to enable the switch 320 to gradually decouple the array 302 from the power converter 308 by being switched from a high duty cycle (e.g., 100% duty cycle) to a low duty cycle (e.g., 0%).

Figure 5:
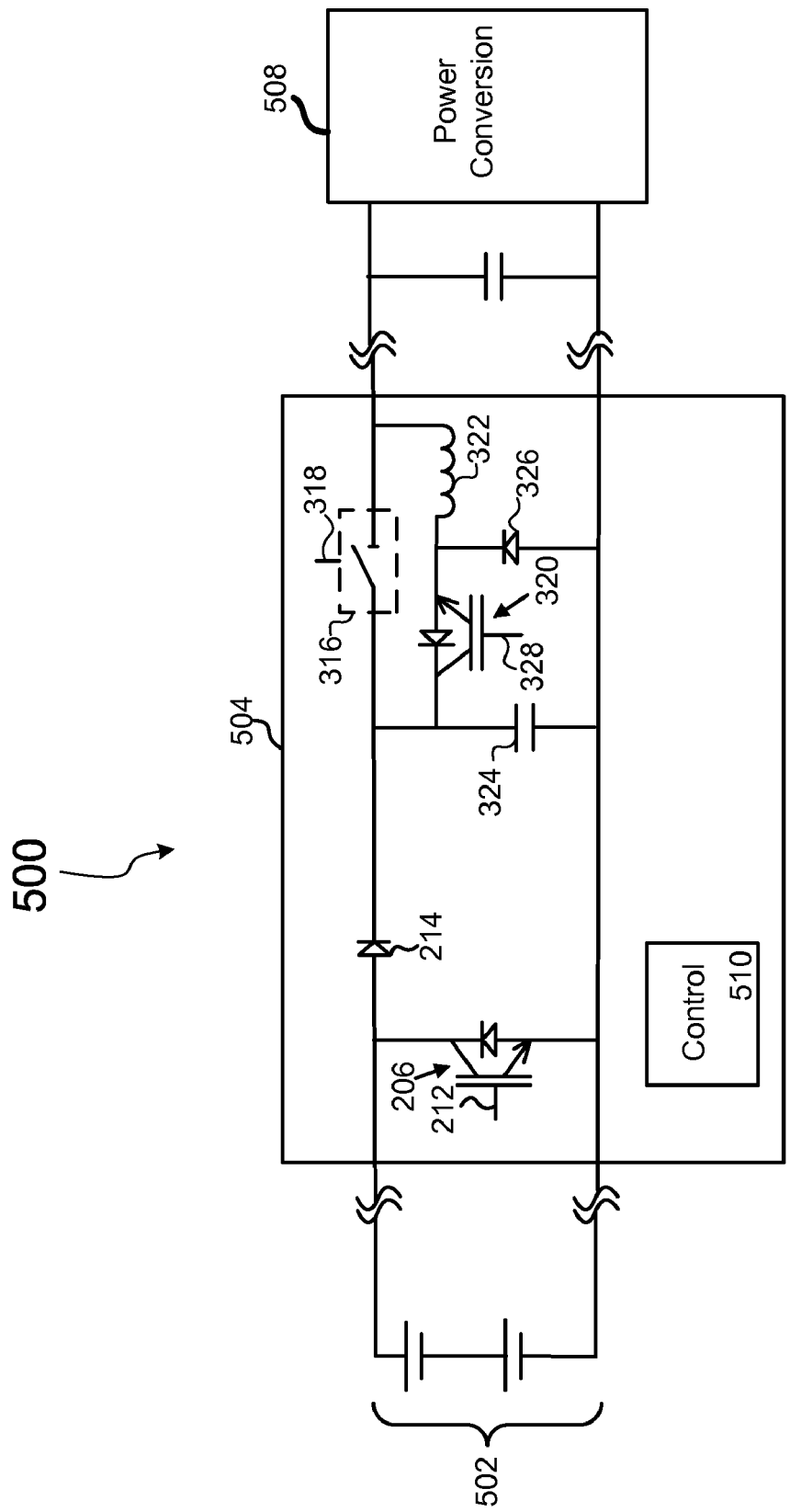
FIG. 5 is a schematic representation of yet another exemplary embodiment of the system described with reference to FIG. 1.

Referring next to FIG. 5, shown is a schematic representation of yet another exemplary embodiment of the system 100 described with reference to FIG. 1. As depicted, the interface 504 in the system 500 includes both a shunt switch 206 and a series-arranged switch 320 controlled by control segment 510. In this embodiment the series switch 320 is utilized during startup to gradually couple the power converter 508 to the array 502 while the array is applying a voltage to the rails of the system 500 in the manner described with reference to FIGS. 3 and 4, and the shunt switch 306 is used to decouple the power converter 508 from the array 502 as described with reference to FIG. 2.

Although either the series switch 320, discussed with reference to FIGS. 3 and 4, or the shunt switch 206, discussed with reference to FIG. 2, may be utilized for both startup and shut down procedures, in this embodiment, the shunt switch 206 is capable of more quickly removing the array 502 from the power converter 508, and the series switch 320 is generally better suited to more smoothly coupling the array 502 to the power converter 508.

Figure 6:
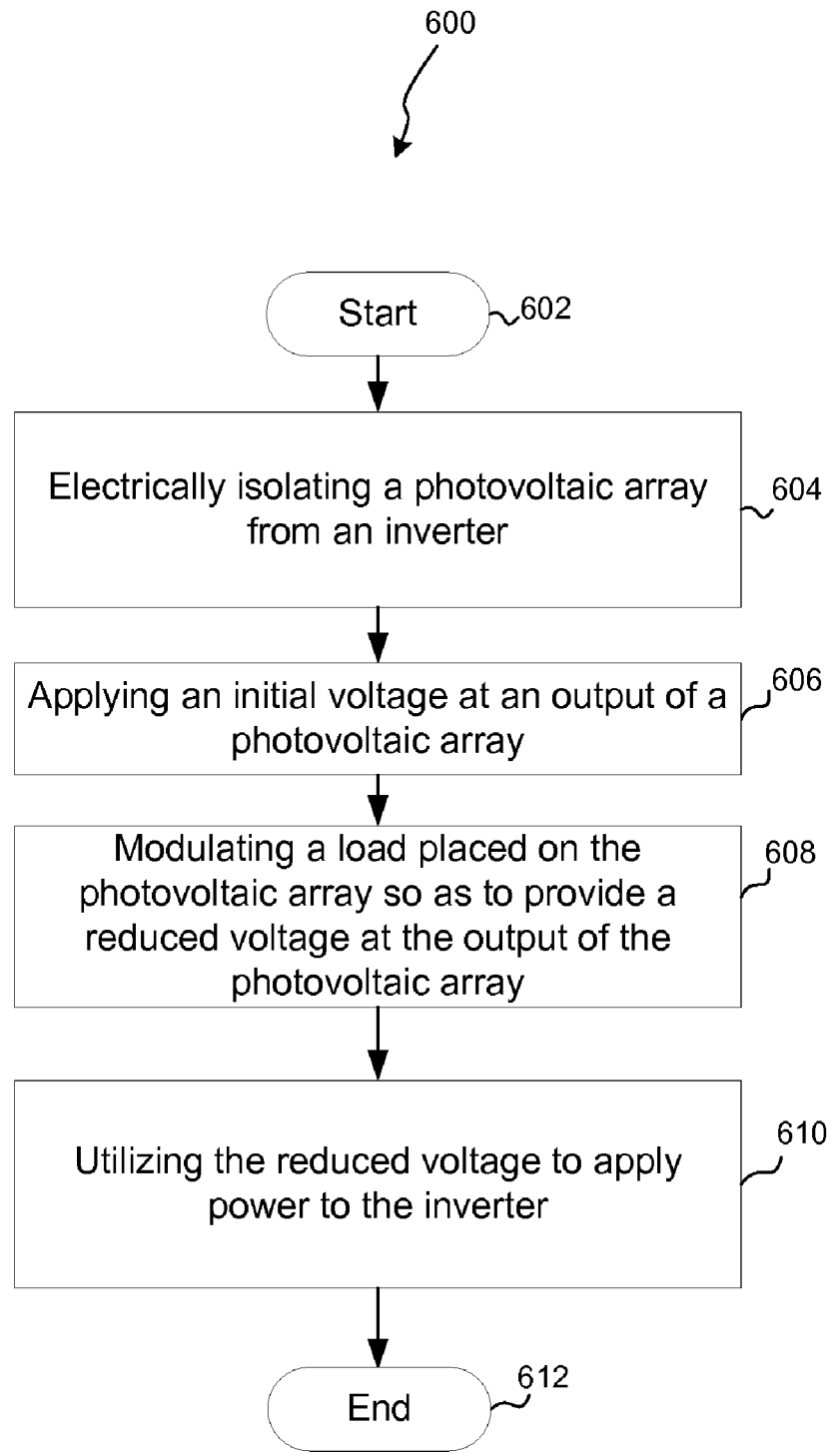
FIG. 6 is a flowchart 600 depicting an exemplary method that may be carried out in connection with the embodiments discussed with reference to FIGS. 1-5.

Referring next to FIG. 6, shown is a flowchart 600 depicting an exemplary method that may be carried out in connection with the embodiments discussed with reference to FIGS. 1-5. As shown, initially a photovoltaic array (e.g., array 102) is electrically isolated from a power converter (e.g., power converter 108) while the array is applying a voltage (e.g., an open-load voltage) at the output of the array (Blocks 602, 604 and 606). A load placed on the photovoltaic array is then modulated so as to provide a reduced voltage at the output of the photovoltaic array, and the reduced voltage is utilized to apply power to the power converter (Blocks 608, 610, and 612).

As discussed, in some embodiments a switch segment that includes a shunt switch (e.g., shunt switch 206) is utilized to modulate a load that is placed on the array. And in other embodiments a switching segment that includes a series-arranged switch (e.g., series-arranged switch 320) is utilized to modulate a load that is placed across the array.

Figure 7:
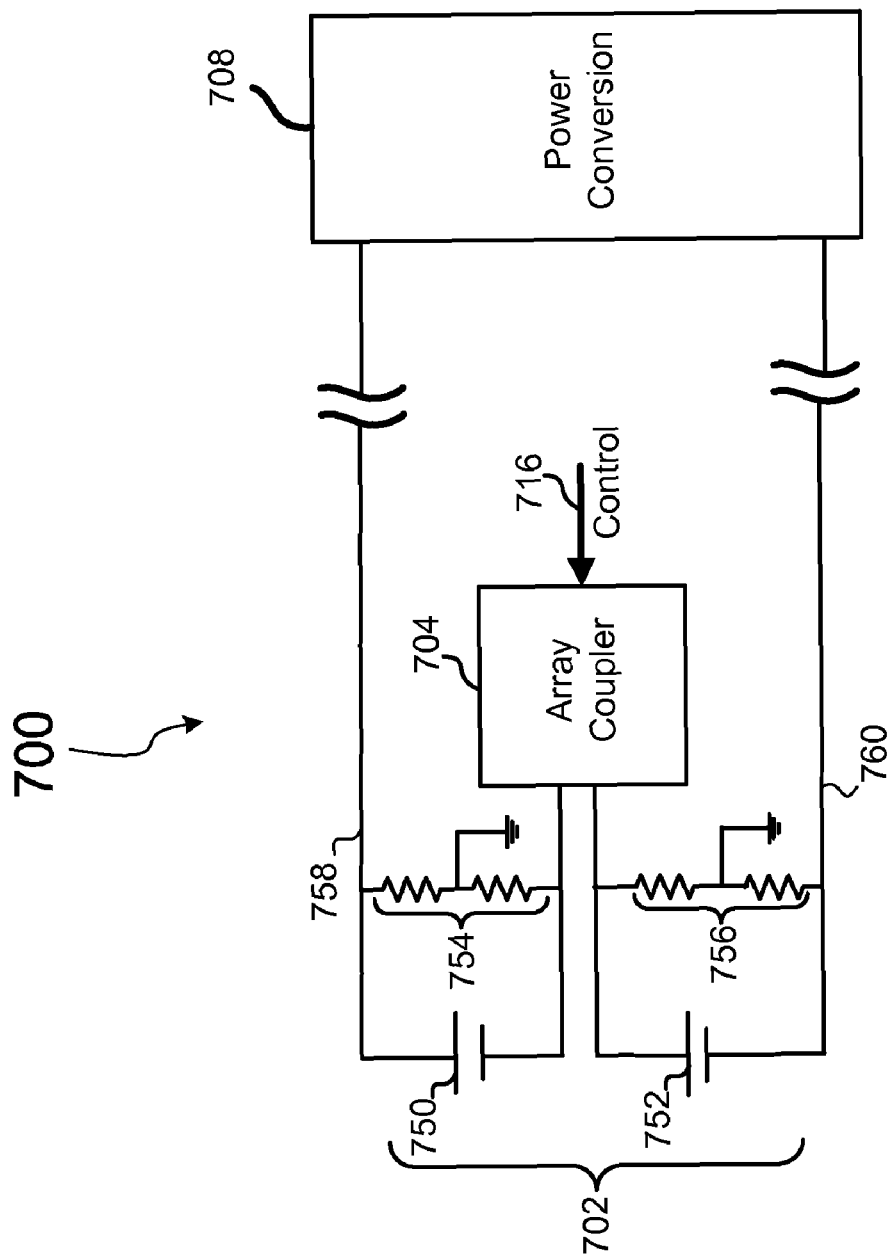
FIG. 7 is a schematic representation of another embodiment of the invention.

Referring next to FIG. 7, shown is a schematic representation of an exemplary embodiment a photovoltaic system 700. As shown, an array coupler 704 couples the negative terminal of a first array 750 and the positive terminal of a second array 752 to create a bipolar photovoltaic array 702, which is coupled to a power conversion component 708. Also shown are a first 754 and second 756 resistor sets, and as depicted, the first resistor set 754 is disposed across the first array 750 and the second resistor set 756 is disposed across the second array 752. In addition, each of the resistor sets 754, 756 includes two resistors and a node between the two resistors of each resistor set 754, 756 is grounded.

Each of the arrays 750, 752 may include PV cells made up of differing materials and may includes cells disposed in a variety of different configurations. For example, the photovoltaic cells may be arranged in parallel, in series or a combination thereof.

In general, each of the resister sets 754, 756 operate to maintain the voltage of either of the rails 758, 760 lower than a maximum voltage relative to ground. In many variations, for example, the resister sets maintain the voltage of each of the rails 758, 760 relative to ground less than a regulatory maximum voltage (e.g., 600 Volts). Although not required, in one embodiment the resistors are sized so that the negative terminal of the first array 750 is about −200 VDC; the positive terminal of the first array 750 is about +500 VDC; the positive terminal of the second array 752 is about +200 VDC; and the negative rail of the second array 752 is about −500 VDC. As a consequence, in this embodiment, the magnitude of the voltage at any node in the system 700 is less than 600 VDC, but the magnitude of the voltage across the entire array 702 (e.g., voltage from rail 758 to rail 760) may be 1000 VDC.

One of ordinary skill in the art, in light of this specification, will appreciate that these specific voltages are merely exemplary and are subject to environmental conditions and the specific implementation of the system. For example, the rail 758 to rail 760 voltage may be between 960 VDC and 830 VDC (e.g., 900 VDC). And in some implementations, the voltage of the rails may be maintained at an optimum voltage for the particular operating conditions the system is operating within.

In general, the array coupler 704 operates to couple the first and second arrays 750, 752 and to control a level of current flowing between the arrays 754, 756 (and as a consequence, control the level of current flowing through the array 702 as a whole). In many variations, when the arrays 750, 752 are offline, the array coupler 704 decouples the arrays 750, 752, and when it is desirable to bring the arrays online, the array coupler 704 initially couples the arrays with, effectively, a high impedance and gradually reduces the impedance that is applied between the arrays so as to gradually load the arrays 750, 752 and gradually reduce the open-load voltage of the arrays 750, 750.

By way of further example, in some embodiments (e.g., when the voltage of the negative terminal of the first array 750 is maintained at −200 VDC and the positive terminal of the second array is maintained at +200 VDC) the array coupler 704 initially begins to bring the arrays 750, 752 online by regulating the 400 VDC that is initially placed across it. And gradually, the array coupler 704 reduces the effective impedance between the first and second arrays 750, 752 so that the current flowing between the arrays 750, 752 gradually increases and the voltage of the negative terminal of the first array 750 and the voltage of the positive terminal of the second array 752 are pulled closer together. And once the arrays 750, 752 are substantially online, the array coupler 704 ties the arrays together (e.g., with a low resistance contactor).

As shown, the array coupler 704 operates responsive to a control signal 716 that may originate remotely (e.g., from a location of the power conversion component 708 or other remote locations) or may be generated at the array coupler 704 (e.g., by a switch).

As depicted, in this embodiment, the array coupler 704 is implemented remotely from the power conversion component 708. One challenging issue for solar PV system designers is placement of the power conversion component 708. Although it is often desirable to place the power conversion equipment 108 (e.g., an inverter) adjacent to the solar array 702, this placement is often not physically possible and/or cost efficient. And the greater the distance between the array 702 and the power conversion equipment 108, the more cost is incurred due to wiring cost and the greater the DC cable losses.

In the present embodiment, the array coupler 704 connects the negative terminal of the first array 750 and the positive terminal of the second array 752 without returning the negative terminal of the first array 750 and the positive terminal of the second array 752 to the power conversion component 708 (e.g., inverter).

In many implementations the positive 758 and negative 760 rails of the array 702 are contained in conduit and are coupled to power conversion component 708 by conductors capable of carrying high levels (e.g., 500 Amps) of current, but a third, high-gauge run between the array coupler 704 and the power conversion component 708 is unnecessary in many variations of the present embodiment. Instead, the control 716 line may be coupled to a controller (e.g., a controller collocated with the power conversion component 708 or located elsewhere) by low gauge (e.g., 16 AWG) wire and the negative terminal of the first array 750 and the positive terminal of the second array 752 may be uncoupled from the power conversion component 708 while the array 702 is applying power to the power conversion component 708.

As a consequence, in many implementations home runs from the negative terminal of the first array 750 and the positive terminal of the second array 752, and the long-length and large diameter wires that would be associated with the home-run legs, not to mention the conduit and installation labor, which can amount to tens of thousands of dollars, are eliminated. As compared to a bi-polar array that is tied together remotely from the array (e.g., adjacent to or within the power conversion component 708), the distance of DC transmission current may be reduced two fold.

Thus, installation of the array coupler 704 between the arrays 750, 752 enables DC wiring losses to potentially be cut in half, and the power conversion component 708 (e.g., inverter) may be positioned near the entrance of the utility feed to the facility to reduce AC losses. The result is either higher total system efficiency or the opportunity to use fewer panels in the system installation for the same energy harvest.

U.S. patent application Ser. No. 12/184,535 entitled SYSTEM, METHOD, AND APPARATUS FOR COUPLING PHOTOVOLTAIC ARRAYS, which is incorporated herein by reference, includes additional details related to implementing a remote PV tie between arrays. And one of ordinary skill in the art, in light of this specification, will appreciate that the functionality of the array coupler 704 (e.g., current controlling capability) may be incorporated with the remote PV tie disclosed within U.S. patent application Ser. No. 12/184,535.

Figure 8:
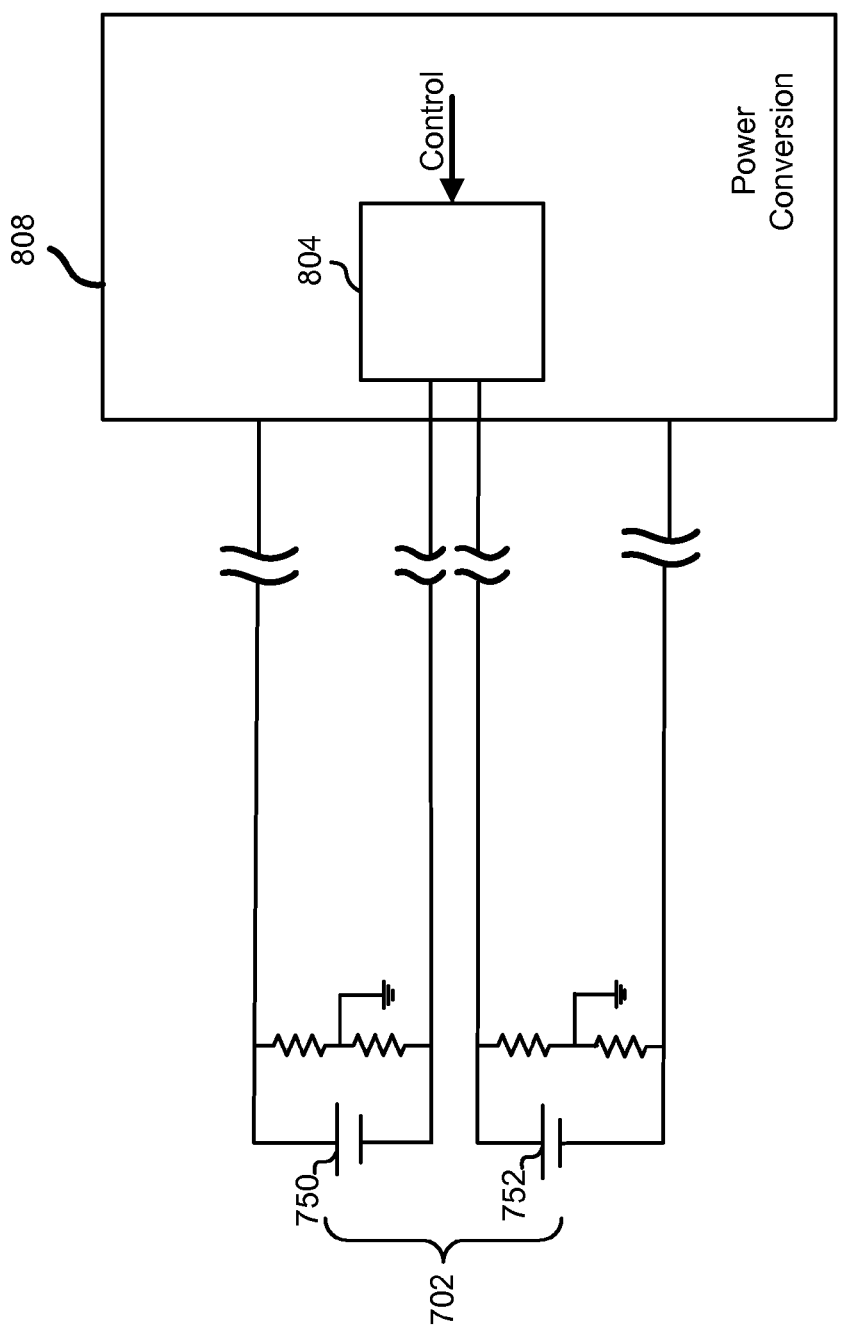
FIG. 8 is a schematic representation of yet another embodiment of the invention.

Referring next to FIG. 8, depicted is another system in which an array coupler 804 is implemented as part of (e.g., within the housing of) a power conversion component 808. The array coupler 804 in this embodiment may generally operate in substantially the same way as the array coupler 704 described with reference to FIG. 7, but in this embodiment DC lines from the negative terminal of the first array 750 and the positive terminal of the second array 752 are run from the array 702 to the power conversion component 808 so that the first and second arrays 750, 752 may be coupled together by the array coupler 804 within the power conversion component 808.

Figure 9:
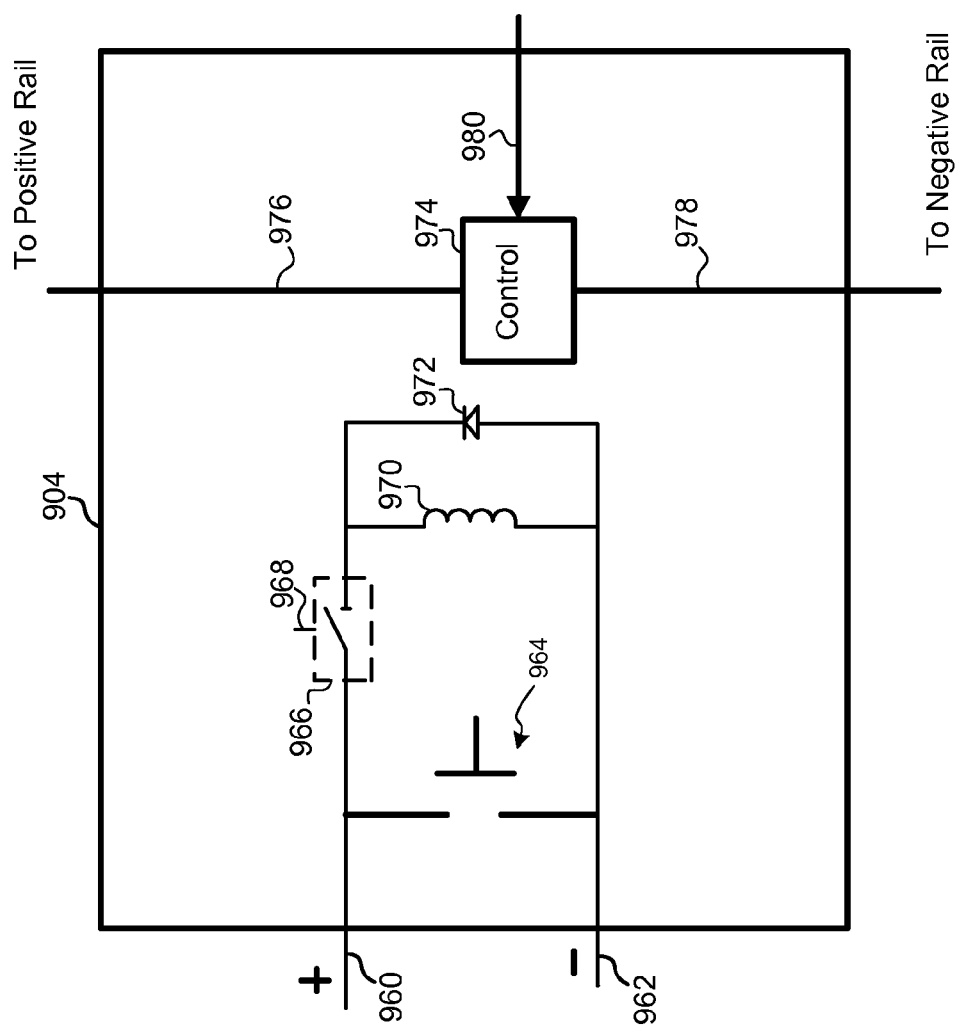
FIG. 9 is a schematic representation of an exemplary embodiment of an array coupler.

Referring to FIG. 9, it is a schematic representation of an exemplary embodiment of an array coupler 904 that may be implemented in connection with the embodiments discussed with reference to FIGS. 7 and 8. As shown, the array coupler 904 in this embodiment includes a first input 960 that is configured to couple to a negative terminal of a first photovoltaic array (e.g., array 750), and a second input 962 adapted to couple to a positive terminal of a second photovoltaic array (e.g., array 752). Also depicted is a contactor 964 configured to switchably couple the first and second inputs 960, 962, and as a consequence, couple the negative line of the first photovoltaic array to the a positive line of a second photovoltaic array so as to place the first and second photovoltaic arrays in series. Also coupled between the first and second inputs are current modulation components including a switch 966, an inductor 970 and diode 972. In addition, a control component 974 is shown coupled to a first feedback line 976 and a second feedback line 978 configured to couple to a positive rail (e.g., positive rail 758) and a negative rail (e.g., negative rail 760) of an array. The control component 974 is also shown coupled to a control line 980.

In some embodiments, the control component 974 is realized by a processor that is configured to execute instructions stored in a memory, but this is not required, and in other embodiments the control segment 974 is realized by hardware and/or firmware. It is also contemplated that the control segment 974 in yet other embodiments is implemented by a combination of hardware, firmware and software. It should also be recognized that the depiction of the control segment 974 is merely logical and that the array coupler 904 may be controlled by control components that are distributed within and/or outside of the array coupler 904.

In operation, when the arrays (e.g., arrays 750, 752) are offline, the contactor 964 and the switch 966 are open so as to decouple the arrays until it is desired to bring the arrays online. And once it is desired to bring the arrays online, a signal 980 (e.g., from a remote location (e.g., a remote control panel) or from a local switch) is sent to the control component 974, and responsive to the control signal 980 the control component 974 generates a control signal 968 that pulse-width modulates (e.g., in a manner similar to the pulse-width modulation described with reference to FIG. 4A) the closing of the switch 966 from a low duty cycle to 100% duty cycle so as to gradually reduce the effective resistance between the first and second terminals 960, 962 of the array coupler 904.

The switch 966 in many modes of operation is pulse width modulated until it is switched at 100% duty cycle and then the contactor 964 is closed to couple the arrays together. As depicted, the switch 966 may be implemented with an inductor 970 to ground and a catch diode 972 that lets current build up in the inductor 970. One of ordinary skill in the art, in light of this specification, will recognize, however, that there are many other types of configurations other than the diode 972 and inductor 970 being in parallel and the combination the diode 972 and inductor 970 being in series with the switch 966.

Feedback lines 976, 978 from the rails (e.g., rails 758, 760) may be used by the control component 974 to control the voltage of either of the rails so that the voltage of the rails operates at a desired level. Responsive to the voltage on the feedback lines, for example, the control component 974 may modulate the effective resistance of the array coupler (e.g., by pulse-width modulating the signal 968 to the switch 966). In many embodiments for example, the voltage of the rails is control so that the voltage of each rail relative to ground is maintained at a value that is less than a regulatory maximum (less than 600 volts). And in many implementations, the control component 974 may control the voltage of the rails to be an optimum voltage that may vary depending upon operating and environmental conditions.

Figure 10:
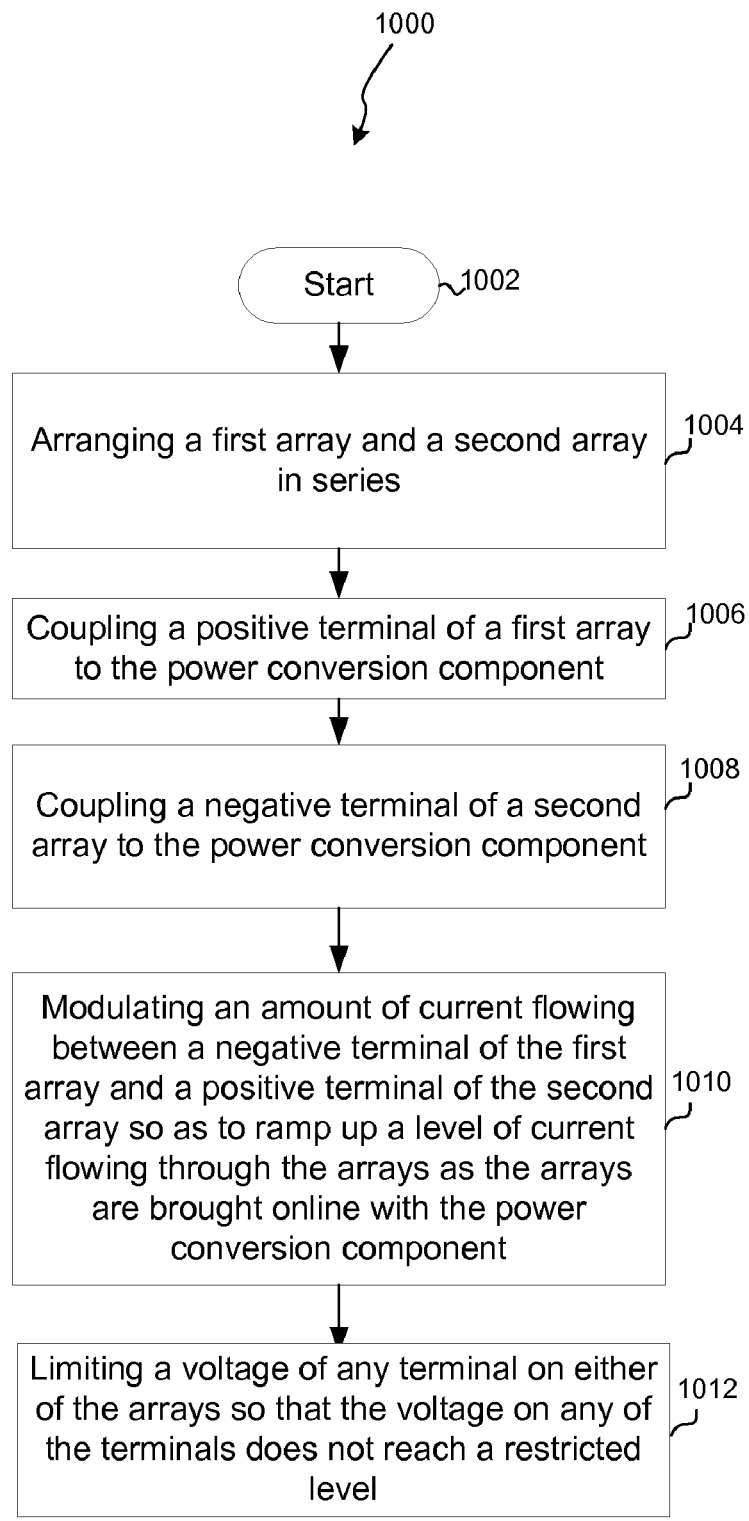
FIG. 10 is a flowchart depicting an exemplary method that may be carried out in connection with the embodiments discussed herein.

Referring next to FIG. 10, it is a flowchart depicting an exemplary method for coupling photovoltaic arrays that may be carried out in connection with the embodiments described with reference to FIGS. 7-9. As shown, a first array (e.g., array 750) and a second array (e.g., 752) are arranged in series, and a positive terminal of the first array is coupled to a power conversion component (e.g., power conversion component 708) and a negative terminal of the second array is coupled the power conversion component. (Blocks 1002, 1004, 1006, 1008).

In many embodiments, an amount of current flowing between a negative terminal of the first array and a positive terminal of the second array is modulated so as to ramp up a level of current flowing through the arrays as the arrays are brought online with the power conversion component (Block 1010). As discussed with reference to FIG. 9, the current may be modulated by pulse-width modulating the amount of time that a switch disposed between the two arrays is closed, but one of ordinary skill in the art, in light of this specification will appreciate that other techniques may be used to modulate (e.g., gradually increase) the amount of current flowing through the arrays.

As discussed above, each array may have a high open load voltage (e.g., 700 VDC) and if the arrays were simply arranged in series the combined rail-to-rail open-load voltage of the series combination of the arrays may be at such a high level (e.g., 1400 VDC) that the power conversion component (if designed for lower voltages) or other components may be damaged. Moreover, there may be regulations (e.g., the low voltage directive of the NEC) that limit voltages at any point in the system to a maximum level. As a consequence, in many implementations, a voltage of any terminal on either of the arrays is limited so that the voltage on any of the terminals does not reach a restricted level (Block 1012). As discussed with reference to FIG. 7, one particular technique to limit the voltage is to place resistor sets (e.g., resistor sets 754, 756) across the arrays.

In conclusion, the present invention provides, among other things, a system and method for managing an application of power from arrays to power conversion components. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A method for coupling photovoltaic arrays with a power conversion component comprising:
arranging a first array and a second array in series;
coupling a positive terminal of a first array to the power conversion component;
coupling a negative terminal of a second array to the power conversion component;
modulating an amount of current flowing between a negative terminal of the first array and a positive terminal of the second array so as to ramp up a level of current flowing through the arrays as the arrays are brought online with the power conversion component; and
limiting a voltage of any terminal on either of the arrays so that the voltage on any of the terminals does not reach a restricted level.

2. The method of claim 1, wherein modulating includes decreasing an effective resistance of the array coupler.

3. The method of claim 2, wherein the modulating includes closing, for successively longer times, a switch so as to increase the amount of current flowing through the first and second photovoltaic arrays.

4. The method of claim 1, wherein a combined open circuit voltage across the arrays exceeds 1300 Volts and wherein, after the arrays are brought online with the power conversion component, the voltage across the arrays is less than 1000 Volts.

5. The method of claim 1 wherein the restricted level of voltage is 600Volts.

6. The method of claim 1, wherein a combined open circuit voltage across the arrays exceeds a design-voltage of the inverter.

* * * * *